(12) United States Patent
Lin et al.

(10) Patent No.: US 12,591,097 B2
(45) Date of Patent: Mar. 31, 2026

(54) COMMUNICATION SOCKET

(71) Applicant: Nanning FuLian FuGui Precision Industrial Co., Ltd., Nanning (CN)

(72) Inventors: Chih-Hsuan Lin, New Taipei (TW); Ying-Jui Huang, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 259 days.

(21) Appl. No.: 18/606,105

(22) Filed: Mar. 15, 2024

(65) Prior Publication Data

US 2025/0291123 A1 Sep. 18, 2025

(51) Int. Cl.
*G02B 6/42* (2006.01)
*H05K 7/20* (2006.01)

(52) U.S. Cl.
CPC ......... *G02B 6/4269* (2013.01); *H05K 7/2049* (2013.01)

(58) Field of Classification Search
CPC .................. G02B 6/4268–4269; H05K 7/2049
See application file for complete search history.

(56) References Cited

U.S. PATENT DOCUMENTS

| | | | | |
|---|---|---|---|---|
| 6,942,506 B2 * | 9/2005 | Kimura | .................. | H01R 13/62 174/16.3 |
| 7,145,773 B2 * | 12/2006 | Shearman | .......... | H05K 7/20418 439/437 |
| 8,081,470 B2 * | 12/2011 | Oki | ...................... | G02B 6/4201 165/185 |
| 8,911,244 B2 * | 12/2014 | Elison | ................ | H05K 7/20409 439/137 |
| 10,222,844 B1 * | 3/2019 | Reddy | ...................... | G06F 1/20 |
| 11,700,712 B2 * | 7/2023 | Chow | .................. | H05K 7/2049 361/710 |
| 11,789,220 B1 * | 10/2023 | Nguyen | ............... | G02B 6/4246 385/92 |

(Continued)

FOREIGN PATENT DOCUMENTS

| | | |
|---|---|---|
| TW | 201729471 A | 8/2017 |
| TW | I819887 B | 10/2023 |
| TW | I832606 B | 2/2024 |

*Primary Examiner* — Robert J Hoffberg
(74) *Attorney, Agent, or Firm* — ScienBiziP, P.C.

(57) ABSTRACT

A communication socket includes a housing, a heat-dissipation element, and an adjustment frame. The housing includes a receiving cavity, and a heat-dissipation opening connected to the receiving cavity. The heat-dissipation element includes a heat-dissipation plate on the housing; a guide element connected to the heat-dissipation plate; and a thermal-conduction block connected to a lower surface of the heat-dissipation plate, and corresponding to the heat-dissipation opening. The adjustment frame is disposed on the heat-dissipation element to move the heat-dissipation element, and includes a pressing block corresponding to the guide element; and a blocking protrusion in the receiving cavity. When the communication module is in the receiving cavity, and adjacent to the blocking protrusion, the thermal-conduction block is separated from the communication module. After the communication module pushes the thermal-conduction block, the pressing block slides with the guide element to make the thermal-conduction block abutting the communication module through the heat-dissipation opening.

15 Claims, 5 Drawing Sheets

(56) References Cited

U.S. PATENT DOCUMENTS

2020/0067230 A1     2/2020  Hamauchi
2023/0240048 A1*    7/2023  Jia ...................... H01L 23/3672
2024/0364056 A1*   10/2024  Yang .................. H01R 13/6581

* cited by examiner

COMMUNICATION SOCKET

FIELD

The subject matter herein generally relates to optical communication sockets with heat-dissipation elements.

BACKGROUND

In order to process huge amounts of data, optical communication is often used as a data transmission method on data servers. With the rapid development of optical communications, the data transmission rate of optical communication modules gradually increases and generates a large amount of heat, which requires a heat dissipation structure for cooling.

The heat dissipation structure is generally installed on the housing of the optical communication socket and extends through the heat-dissipation opening on the housing. When the optical communication module is inserted into the housing, its upper surface contacts the heat dissipation structure to conduct heat.

However, when the optical communication module is repeatedly plugged and unplugged, scratches will occur on the lower surface of the heat dissipation structure, which increases the thermal resistance between the heat dissipation structure and the optical communication module, thereby reducing the heat dissipation effect of the optical communication module.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
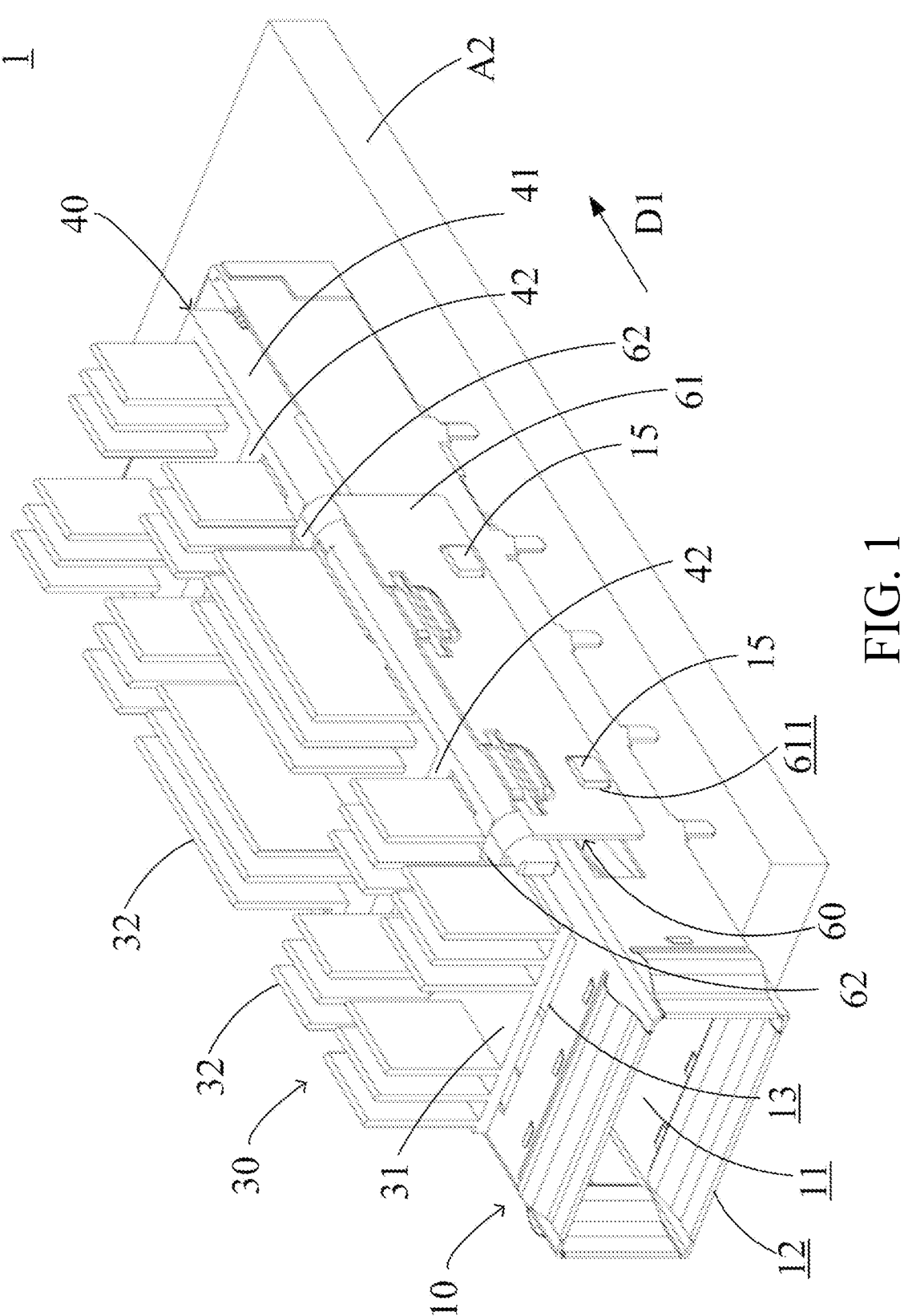
FIG. 1 is a schematic view of an embodiment of a communication socket in accordance with the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connect" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

In the present invention, an adjustment frame is provided in a communication socket, which can lift a heat-dissipation element to separate from the upper surface of the optical communication module during the process of plugging and unplugging the optical communication module. Since the probability of scratches on the heat-dissipation element and the optical communication module is reduced, the heat-dissipation effect of the heat-dissipation element for the optical communication module shall not be caused.

Figure 2:
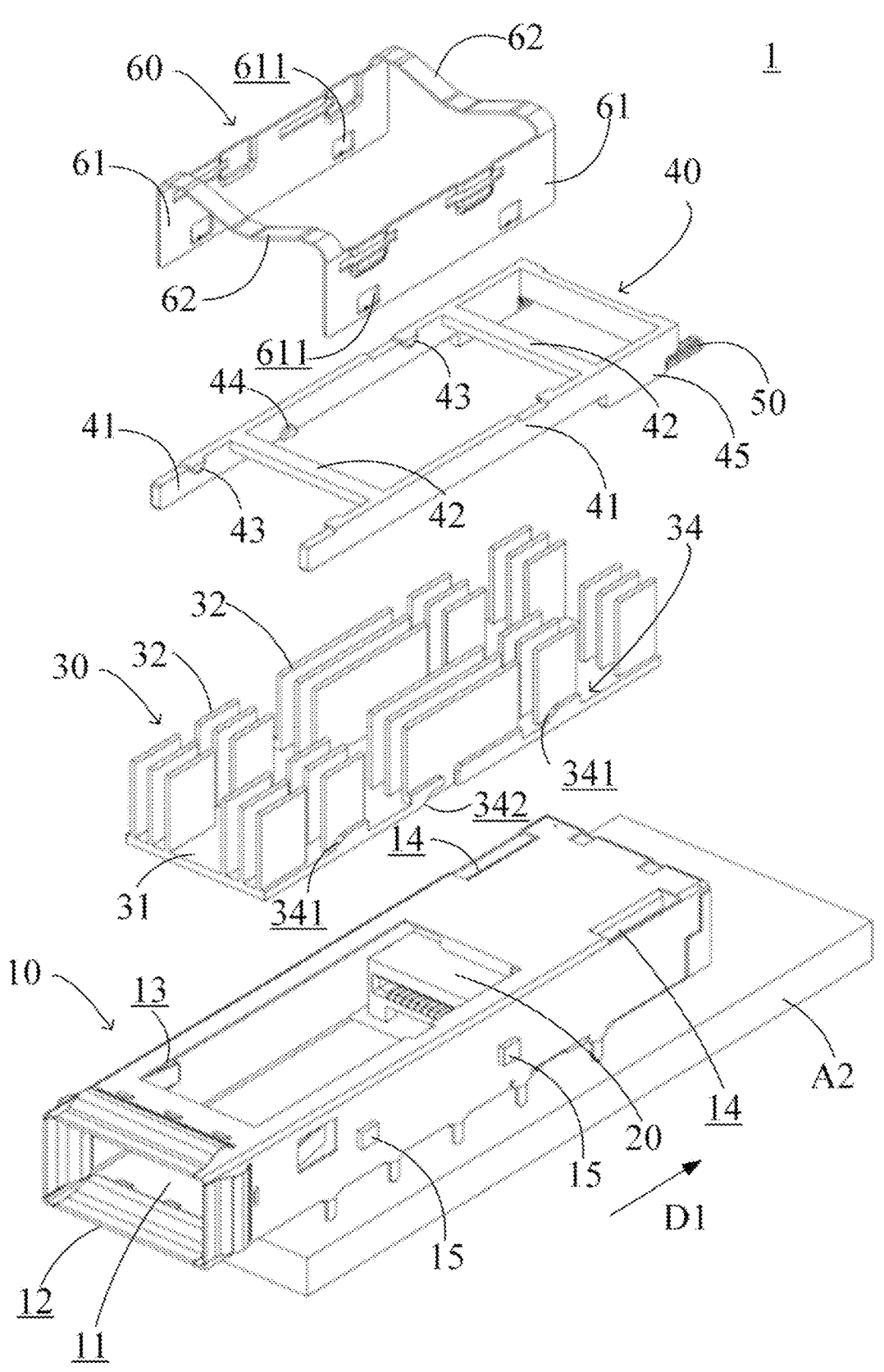
FIG. 2 is an exploded view of the communication socket shown in FIG. 1.
Figure 3:
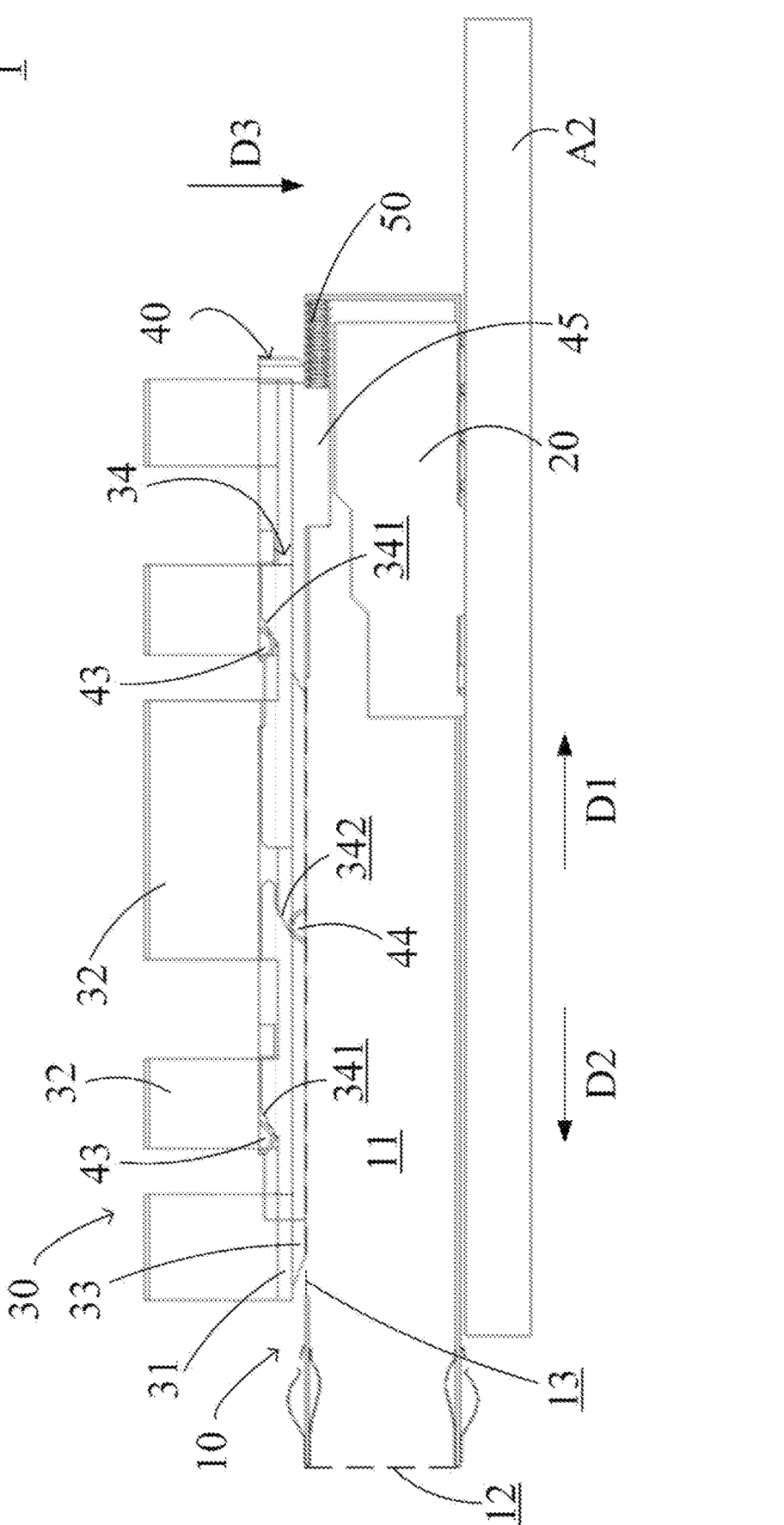
FIG. 3 is a cross-sectional view of the communication socket shown in FIG. 1.

FIG. 1 is a schematic view of a communication socket 1 in accordance with an embodiment of the present disclosure. FIG. 2 is an exploded view of the communication socket 1 shown in FIG. 1. FIG. 3 is a cross-sectional view of the communication socket 1 shown in FIG. 1. The communication socket 1 can be disposed on a circuit board A2 of an electronic device. The communication module A1 shown in FIG. 4 can be inserted in the communication socket 1, and electrically connected to the communication socket 1. In the embodiment, the electronic device may be a server or a router, etc. The communication socket 1 may be an optical communication socket, and the communication module A1 may be an optical communication module.

The optical fiber can be inserted into the communication module A1. The communication module A1 receives optical signals from the optical fiber and converts the optical signals into electronic signals, and the communication module A1 transmits the electronic signals to the circuit board A2 through the communication socket 1. Moreover, the electronic device can output electronic signals to the communication module A1 through the circuit board A2 and the communication socket 1, and the electronic signals can be converted into optical signals through the communication module A1. The communication module A1 can transmit optical signals to the optical fiber.

The communication socket 1 includes a housing 10, a connector 20, a heat-dissipation element 30, an adjustment frame 40, elastic elements 50, and a combination frame 60. The housing 10 may be a metal housing. The housing 10 may be an elongated structure, and extend in an insertion direction D1. The housing 10 includes a receiving cavity 11, and insertion opening 12, a heat-dissipation opening 13 and through holes 14. The receiving cavity 11 extends in the insertion direction D1. The insertion opening 12, the heat-dissipation opening 13, and the through holes 14 are connected to the receiving cavity 11. The insertion opening 12 is formed on the front side of the housing 10. The heat-dissipation opening 13 and the through holes 14 are formed on the upper surface of the housing 10. The lower surface of the housing 10 faces the circuit board A2.

In the embodiment, the area of the heat-dissipation opening 13 is greater than the area of the opening of the through hole 14. The area of the heat-dissipation opening 13 is greater than a half of the area of the upper surface of the housing 10. The heat-dissipation opening 13 and the through holes 14 are elongated, and extend in the insertion direction D1. The heat-dissipation opening 13 is close to the insertion opening 12. The through hole 14 is close to the rear side of the housing 10, and in the edge of the upper surface of the housing 10.

The connector 20 is disposed in the receiving cavity 11, and is in the rear side of the housing 10. In the embodiment, the communication module A1 is inserted into the receiving cavity 11 through the insertion opening 12. The connector 20 may be an electrical connector, receiving electronic signals output from the communication module A1, or outputting electronic signals to the communication module A1.

The heat-dissipation element 30 is movably disposed on the housing 10. The heat-dissipation element 30 includes a heat-dissipation plate 31, fins 32, a thermal-conduction block 33, and guide elements 34. The heat-dissipation plate 31, the fins 32, a thermal-conduction block 33, and guide elements 34 may be integrally formed, and may be made of the same thermally conductive material, such as metal. The heat-dissipation plate 31 is on the upper surface of the housing 10. The heat-dissipation plate 31 may be an elongated structure, extending in the insertion direction D1. The heat-dissipation plate 31 may be parallel to the upper surface of the housing 10. In a direction perpendicular to the upper surface of the heat-dissipation plate 31, the heat-dissipation plate 31 covers the heat-dissipation opening 13.

The fins 32 are connected to the upper surface of the heat-dissipation plate 31. The fins 32 may extend perpendicular to the upper surface of the heat-dissipation plate 31. The fins 32 may be parallel to and separated from each other. The thermal-conduction block 33 is connected to the lower surface of the heat-dissipation plate 31, and located corresponding to the heat-dissipation opening 13. The lower surface of the heat-dissipation plate 31 faces the housing 10. The thermal-conduction block 33 is an elongated structure, extending in the insertion direction D1. In a direction perpendicular to the lower surface of the heat-dissipation plate 31, the thermal-conduction block 33 covers the heat-dissipation opening 13. The lower surface of the thermal-conduction block 33 faces the heat-dissipation opening 13 of the housing 10. The area of the lower surface of the thermal-conduction block 33 is equal to or approximately equal to the area of the heat-dissipation opening 13. The term of "approximately equal to" means within a tolerance range of 10% to −10%. The thickness of the thermal-conduction block 33 is in the range of 0.3 times to 3 times the thickness of the heat-dissipation plate 31. The thickness of the thermal-conduction block 33 and the thickness of the heat-dissipation plate 31 are measured in the same direction, which is perpendicular to the insertion direction D1.

The guide elements 34 are respectively connected to the two opposite sides of the heat-dissipation plate 31. In other words, the heat-dissipation plate 31 is between the guide elements 34. The guide elements 34 may be elongated plate, extending in the insertion direction D1, and perpendicular to the heat-dissipation plate 31. In the embodiment, each guide element 34 includes a pressing surface 341 and a lifting surface 342. The pressing surface 341 and the lifting surface 342 are inclined relative to the extensions of the upper surface and the lower surface of the heat-dissipation plate 31, and inclined relative to the insertion direction D1. The pressing surface 341 may be parallel to and separated from the lifting surface 342. In the embodiment, the pressing surface 341 is located on the upper side of the guide element

34, and the lifting surface 342 is located on the lower side of the guide element 34. The lower surface of the guide element 34 is opposite to the upper side of the guide element 34, and faces the upper surface of the housing 10. In the embodiment, the shortest distance between the pressing surface 341 and the upper surface of the housing 10 is greater than the shortest distance between the lifting surface 342 and the upper surface of the housing 10.

The adjustment frame 40 is disposed on the heat-dissipation element 30, and is used to move the heat-dissipation element 30. The adjustment frame 40 includes main rods 41, connection rods 42, pressing blocks 43, lifting blocks 44, and blocking protrusions 45. The main rods 41, the connection rods 42, the pressing blocks 43, the lifting blocks 44, and the blocking protrusions 45 may be integrally formed, and made from the same material, such as metal or plastic. The main rods 41 are adjacent to the guide elements 34 and the heat-dissipation plate 31. In other words, the guide elements 34 and the heat-dissipation plate 31 are between the main rods 41. The main rods 41 extend in the insertion direction D1, and are parallel to each other. The connection rods 42 are connected to the main rods 41, and between the main rods 41. The connection rods 42 extend perpendicular to the insertion direction D1, and parallel to each other. In the embodiment, the connection rods 42 abut the upper surface of the heat-dissipation plate 31, and between the fins 32.

The pressing blocks 43 are connected to the inner side of the main rods 41, and located correspondingly to the guide elements 34. In the embodiment, the pressing blocks 43 contact with the pressing surfaces 341. When the adjustment frame 40 is moved relative to the heat-dissipation element 30, the pressing blocks 43 slide on the pressing surfaces 341.

The lifting blocks 44 are connected to the inner sides of the main rods 41, and located correspondingly to the guide elements 34. In the embodiment, the lifting blocks 44 contact with the lifting surfaces 342. When the adjustment frame 40 is moved relative to the heat-dissipation element 30, the lifting blocks 44 slide on the lifting surfaces 342.

The blocking protrusions 45 are connected to the lower surfaces of the main rods 41, and in the receiving cavity 11. In the embodiment, the blocking protrusions 45 are connected to the rear sides of the main rods 41, and adjacent to the rear sides of the housing 10. The blocking protrusions 45 extend into the receiving cavity 11 through the through holes 14 of the housing 10, and are close to the connector 20. The length of through hole 14 is greater than the length of blocking protrusion 45. The length of through hole 14 and the length of blocking protrusion 45 are measured in the same direction, which is parallel to insertion direction D1.

The elastic elements 50 are in the receiving cavity 11, and abut the adjustment frame 40. The elastic elements 50 are close to the connector 20. In the embodiment, one end of the elastic element 50 abuts the blocking protrusion 45, and the other end of the elastic element 50 abuts the housing 10. The elastic element 50 may be a spring. The elastic element 50 applies elastic force to the adjustment frame 40 to maintain the adjustment frame 40 at an initial position in FIG. 3 and FIG. 4, and then the adjustment frame 40 can maintain the heat-dissipation element 30 in a lifting position. When the heat-dissipation element 30 is in the lifting position, the thermal-conduction block 33 is separated from the receiving cavity 11.

In one embodiment, when the adjustment frame 40 is in the initial position, the lifting block 44 maintains the heat-dissipation element 30 in the lifting position, and the lower surface of the thermal-conduction block 33 is separated from the heat-dissipation opening 13. In another embodiment, when the adjustment frame 40 is in the initial position, the lower surface of the thermal-conduction block 33 is located in the heat-dissipation opening 13.

The combination frame 60 is disposed on the housing 10, and restricts the heat-dissipation element 30 and the adjustment frame 40 on the housing 10. The combination frame 60 includes main plates 61 and elastic sheets 62. The main plates 61 extend in the insertion direction D1, and the heat-dissipation plate 31, the guide element 34, and/or the adjustment frame 40 are between the main plates 61. Each main plates 61 includes locking holes 611. The housing 10 includes locking structures 15 connected to the sides of the housing 10. The locking structures 15 is in the locking holes 611 to fasten the combination frame 60 on the housing 10. The elastic sheets 62 are connected to the main plates 61, and abut the upper surface of the heat-dissipation plate 31. The elastic sheets 62 provide pressing force to the heat-dissipation element 30.

Figure 4:
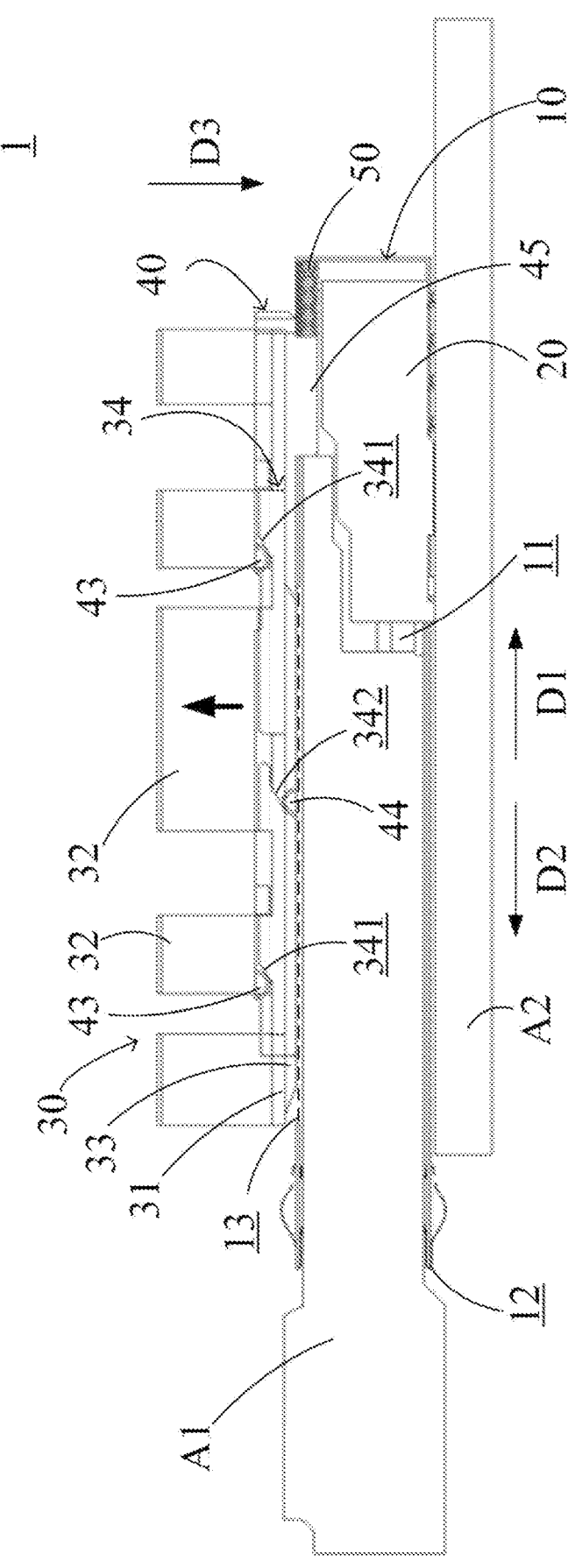
FIG. 4 and FIG. 5 are schematic views of the communication socket in an operation process.

FIG. 4 is a schematic view of the communication socket 1 in an operation process, wherein the heat-dissipation element 30 is in a lifting position, the adjustment frame 40 is in an initial position, and the communication module A1 is in a starting position. In FIG. 4, the communication module A1 is inserted into the receiving cavity 11 of the housing 10 through the insertion opening 12 in the insertion direction D1, and reaches the starting position adjacent to the blocking protrusion 45. In other words, during the communication module A1 moving from the insertion opening 12 to the starting position, the blocking protrusion 45 is not moved by the communication module A1, and thus the elastic force generated by the elastic element 50 can maintain the heat-dissipation element 30 in the lifting position in FIG. 3 and FIG. 4. Moreover, during the communication module A1 moving from the insertion opening 12 to the starting position, the communication module A1 does not contact with the thermal-conduction block 33, and thus the thermal-conduction block 33 is difficult to cause scratches on the upper surface of the communication module A1 during the movement of the communication module A1, and thus the heat dissipation effect of the communication module A1 shall not be caused.

Figure 5:
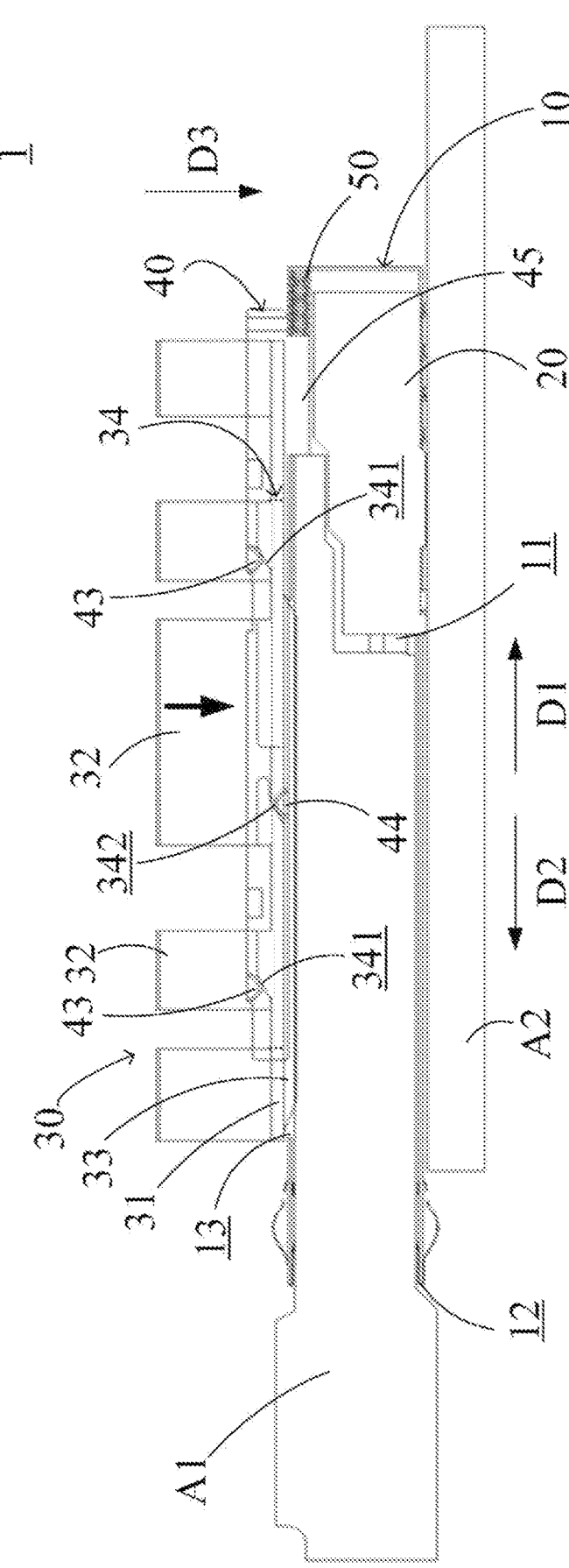

FIG. 5 is a schematic view of the communication socket 1 in an operation process, wherein the heat-dissipation element 30 is in a pressing position, and the communication module A1 is in a final position. During the communication module A1 is moved from the starting position to the final position in FIG. 5 in the insertion direction D1, so as to be inserted into and electrically connected to the connector 20, the communication module A1 pushes the blocking protrusion 45 to move in the insertion direction D1. At this time, the pressing block 43 and the lifting block 44 move along the insertion direction D1 with the adjustment frame 40. The pressing block 43 slides on the pressing surface 341 of the guide element 34, and the lifting block 44 may slide on the lifting surface 342 of the guide element 34.

In the embodiment, by the lifting block 44 sliding on the lifting surface 342 of the guide element 34 toward the upper end of the lifting surface 342, the heat-dissipation element 30 is movable along the pressing direction D3.

Moreover, by sliding the pressing block 43 along the pressing surface 341 of the guide element 34 toward the upper end of the pressing surface 341, the pressing block 43 pushes the thermal-conduction block 33 of the heat-dissipation element 30 to move along the pressing direction D3, and through the heat-dissipation opening 13 is in contact with the upper surface of communication module A1. In the embodiment, the pressing direction D3 may be perpendicular to insertion direction D1.

In the embodiment, the thermal-conduction block 33 does not contact the upper surface of the communication module A1 until the communication module A1 is in the final position or adjacent to the final position. In other words, when communication module A1 is electrically connected to connector 20, thermal-conduction block 33 abuts communication module A1 through the heat-dissipation opening 13. Therefore, the probability of scratches on the upper surface of communication module A1 caused by thermal-conduction block 33 can be reduced.

In the embodiment, when the communication module A1 is removed from the communication socket 1, the communication module A1 moves in the removing direction D2 opposite to the insertion direction D1. When the communication module A1 is moved from the final position in FIG. 5 to the starting position in FIG. 4, the elastic element 50 pushes the blocking protrusion 45 of the adjustment frame 40 to move in the removing direction D2. The pressing block 43 can slide on the pressing surface 341 of the guide element 34 toward the lower end of the pressing surface 341. The lifting block 44 slides toward the lower end of the lifting surface 342 relative to the guide element 34, thereby lifting the heat-dissipation element 30 from the pressing position in FIG. 5 to the lifting position in FIG. 4. In other words, when the heat-dissipation element 30 is lifted from the pressing position to the lifting position, the lifting block 44 lifts the thermal-conduction block 33 to reduce the probability that the thermal-conduction block 33 causes scratches on the upper surface of the communication module A1.

In the embodiment, during the movement of the communication module A1 from the starting position to leaving the insertion opening 12 of the housing 10 in the removal direction D2, the elastic element 50 and the adjustment frame 40 maintain the heat-dissipation element 30 in the lifting position in FIG. 3 and FIG. 4, and thus the thermal-conduction block 33 of the heat-dissipation element 30 is separated from the upper surface of the communication module A1. In the embodiment, the thermal-conduction block 33 is difficult to cause scratches on the upper surface of the heat-dissipation element 30 during the movement of the heat-dissipation element 30, and thus the heat dissipation effect of the heat-dissipation element 30 for the optical communication module A1 shall not be caused.

In the present disclosure, the adjustment frame 40 and the guide element 34 of the heat-dissipation element 30 are lifted to separate from the upper surface of the optical communication module A1 during the movement of the optical communication module A1. Therefore, the probability of scratches on the lower surface of the thermal-conduction block 33 is reduced, and the heat-dissipation effect of the heat-dissipation element 30 for the optical communication module A1 is not caused.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A communication socket comprising:
a housing comprising a receiving cavity for a communication module, and a heat-dissipation opening connected to the receiving cavity;
a heat-dissipation element comprising:
a heat-dissipation plate placed on the housing;
a guide element connected to the heat-dissipation plate; and
a thermal-conduction block connected to a lower surface of the heat-dissipation plate, and located correspondingly to the heat-dissipation opening; and
an adjustment frame disposed on the heat-dissipation element, the adjustment frame configured to move in an insertion direction of the communication module and to move the heat-dissipation element in the insertion direction of the communication module, and comprising:
a pressing block corresponding to the guide element; and
a blocking protrusion in the receiving cavity,
wherein when the communication module is in the receiving cavity, and adjacent to the blocking protrusion of the adjustment frame, the thermal-conduction block of the heat-dissipation element is separated from the communication module, and
after the communication module pushes the thermal-conduction block of the heat-dissipation element, the pressing block of the adjustment frame slides with the guide element of the heat-dissipation element to make the thermal-conduction block abutting the communication module through the heat-dissipation opening.

2. The communication socket as claimed in claim 1 further comprising a connector disposed in the receiving cavity, wherein when the communication module is electrically connected to the connector, the thermal-conduction block abuts the communication module through the heat-dissipation opening.

3. The communication socket as claimed in claim 2, wherein the housing further comprises a through hole connected to the receiving cavity, the blocking protrusion protrudes into the receiving cavity through the through hole, and is close to the connector,
a length of the through hole is greater than a length of the blocking protrusion, and the length of the through hole and the length of the blocking protrusion are measured in a same direction.

4. The communication socket as claimed in claim 2 further comprising an elastic element abutting the adjustment frame, and close to the connector, wherein when the blocking protrusion is not being pushed by the communication module, the elastic element maintains the adjustment frame in an initial position wherein the thermal-conduction block is separated from the receiving cavity.

5. The communication socket as claimed in claim 2, wherein the connector is at a rear side of the housing, an insertion opening of the housing is defined at a front side of the housing, and the communication module is inserted into the receiving cavity through the insertion opening.

6. The communication socket as claimed in claim 1, wherein the heat-dissipation element further comprises a plurality of fins connected to an upper surface of the heat-dissipation plate.

7. The communication socket as claimed in claim 1, wherein the guide element further comprises an pressing surface which is inclined relative to the heat-dissipation plate, and
when the communication module pushes the thermal-conduction block, the pressing block slides on the pressing surface.

8. The communication socket as claimed in claim 1, wherein the adjustment frame further comprises a lifting block located correspondingly to the guide element,
when the adjustment frame is in an initial position, the lifting block maintains the heat-dissipation element in a lifting position, and the thermal-conduction block is separated from the receiving cavity.

9. The communication socket as claimed in claim 8, wherein the guide element further comprises a lifting surface which is inclined relative to the heat-dissipation plate, and
when the heat-dissipation element is lifted from a pressing position to the lifting position, the lifting block slides on the lifting surface.

10. The communication socket as claimed in claim 1, wherein the guide element extends in the insertion direction, and connected to a side of the heat-dissipation plate.

11. The communication socket as claimed in claim 1, wherein the adjustment frame comprises a main rod, and a connection rod connected to the main rod, the main rod is adjacent to the guide element, the pressing block is connected to a side surface of the main rod, and the connection rod abuts an upper surface of the heat-dissipation plate.

12. The communication socket as claimed in claim 11, wherein the blocking protrusion is connected to a lower surface of the main rod.

13. The communication socket as claimed in claim 1 further comprising a combination frame disposed on the housing, and restricting the heat-dissipation element and the adjustment frame on the housing.

14. The communication socket as claimed in claim 13, wherein the combination frame further comprises a main plate, the main plate comprises a locking hole, the housing comprises a locking structure, and the locking structure is fastened in the locking hole.

15. The communication socket as claimed in claim 14, wherein the combination frame further comprises an elastic sheet connected to the main plate, and abutting an upper surface of the heat-dissipation plate.

* * * * *